United States Patent [19]
Johnson et al.

[11] Patent Number: 5,227,320
[45] Date of Patent: Jul. 13, 1993

[54] METHOD FOR PRODUCING GATE OVERLAPPED LIGHTLY DOPED DRAIN (GOLDD) STRUCTURE FOR SUBMICRON TRANSISTOR

[75] Inventors: Eric A. Johnson, San Jose; Ying T. Loh, Saratoga; Yoshiko H. Strunk, Sunnyvale; Chung S. Wang, Fremont, all of Calif.

[73] Assignee: VLSI Technology, Inc., San Jose, Calif.

[21] Appl. No.: 757,412

[22] Filed: Sep. 10, 1991

[51] Int. Cl.$^5$ .......................................... H01L 21/335
[52] U.S. Cl. .................................... 437/44; 437/200; 437/239
[58] Field of Search ............... 437/44, 200, 41, 238, 437/239; 357/23.3, 23.4, 67 S, 71 S

[56] References Cited

U.S. PATENT DOCUMENTS

| | | | |
|---|---|---|---|
| 4,567,058 | 1/1986 | Koh | 437/173 |
| 4,716,131 | 12/1987 | Okazawa et al. | 437/41 |
| 4,971,922 | 11/1990 | Watabe et al. | 437/233 |
| 5,003,375 | 3/1991 | Ichikawa | 437/200 |

FOREIGN PATENT DOCUMENTS 62-45180 2/1987 Japan .

OTHER PUBLICATIONS

Wolf, S., et al., Silicon Processing, vol. 1, Process Technology, pp. 384-399, 1986, Lattice Press.
J. E. Moon, et al., "A New LDD Structure: Total Overlap with Polysilicon Spacer (TOPS)", IEEE Electronic Device Letters, May 1990, pp. 221-223.
T. Y. Huang: "A novel SubMicron LDD Transistor with Inverse-T Gate Structure", IEDM, 1986, pp. 742-745.
R. Izawa, et al., "The Impact of Gate-Drain Overlapped LDD (GOLD) For Deep SubMicron VLSIs", IEDM 1987, pp. 38-41.

Primary Examiner—T. N. Quach
Attorney, Agent, or Firm—Hickman and Associates

[57] ABSTRACT

A method produces a transistor with an overlapping gate. A first gate region is placed on a substrate between two source/drain regions. The first gate region includes a polysilicon region on top of a dielectric region. Gate overlap regions are placed around the polysilicon region. The gate overlap regions extend out over the two source/drain regions. The gate overlap regions are formed of a metal-silicide layer, for example Titanium-silicide. A top portion of the metal-silicide layer is oxidized to form a silicon dioxide layer on top of the metal-silicide layer. At the time of oxidation, the metal-silicide layer is also annealed to which further helps to improves the Titanium-silicide stoichiometry.

9 Claims, 3 Drawing Sheets

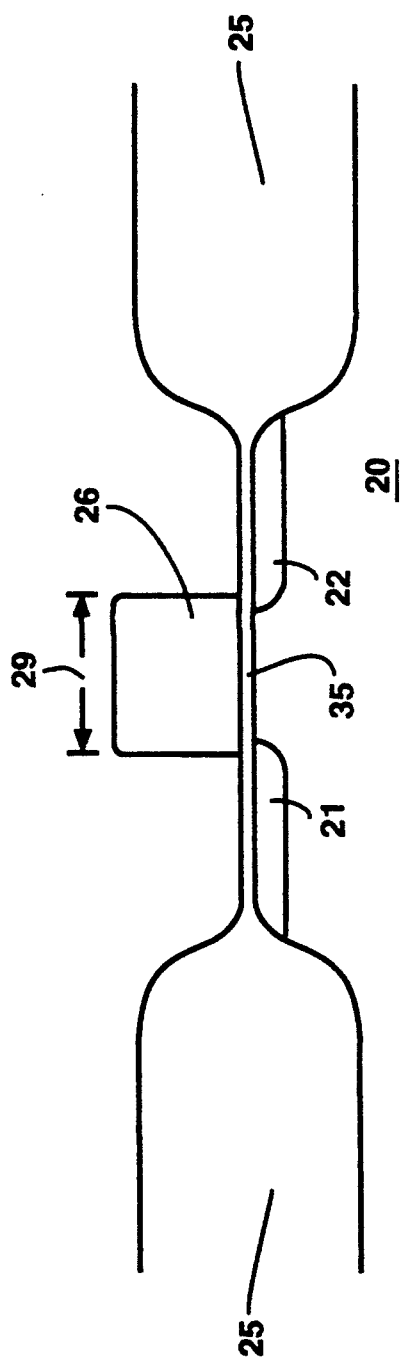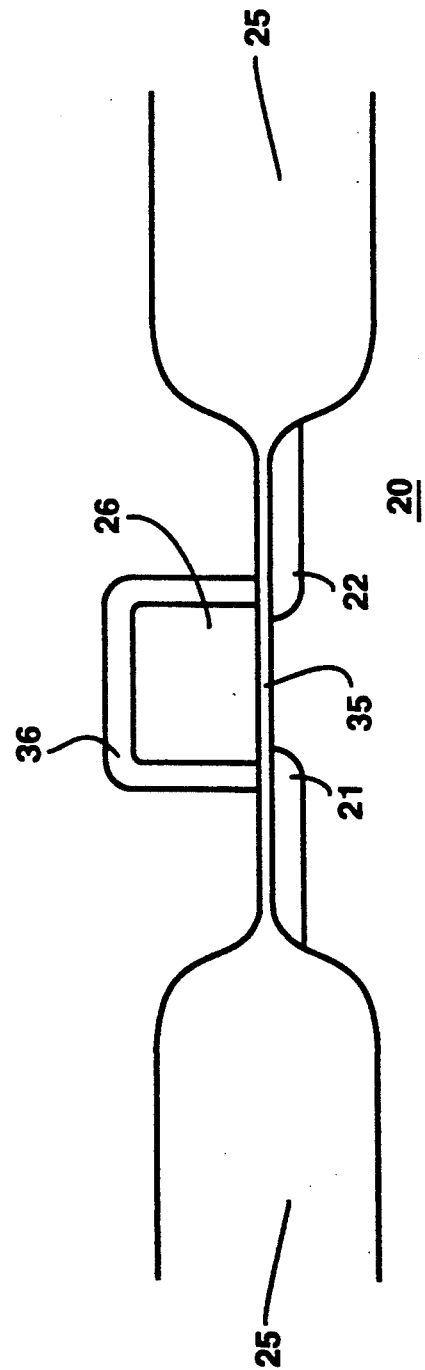

METHOD FOR PRODUCING GATE OVERLAPPED LIGHTLY DOPED DRAIN (GOLDD) STRUCTURE FOR SUBMICRON TRANSISTOR

BACKGROUND

The present invention concerns a gate overlapped lightly doped drain (GOLDD) process for use in producing high reliability submicron metal oxide silicon field effect transistors (MOSFETs).

The use of GOLDD processes for high speed reliable submicron MOSFETs has been investigated. For example, in one process, referred to as total overlap with polysilicon spacer (TOPS), three deposits of polysilicon are use to form a gate region of a transistor which overlaps the source and drain region of the transistor. See J.E. Moon, et al., *A New LDD Structure: Total Overlap with Polysilicon Spacer (TOPS)*, IEEE Electronic Device Letters, May 1990, pp. 221-223. See also T.Y Huang: *A novel SubMicron LDD Transistor with Inverse-T Gate Structure*, IEDM, 1986, pp. 742-745, and R. Izawa, et. al., *The Impact of Gate-Drain Overlapped LDD(GOLD) For Deep SubMicron VLSIs*, IEDM 1987, pp. 38-41.

The presence of an overlapping gate in submicron processing of MOSFETs has several advantages. For example, devices which use overlapping gates show improvements in performance and reliability. Further, such devices have shown a smaller sensitivity to $n^-$ dose variations. However, existing GOLDD processes are complex and not suitable for use in a volume production environment. For example, the three polysilicon depositions required for the TOPS process makes the process impractical for use in manufacturing VLSI circuits. It is desirable, therefore, to develop methods to produce MOSFETs using GOLDD processes which are also suitable for use in a manufacturing environment.

SUMMARY OF THE INVENTION

In accordance with the preferred embodiment of the present invention, a method is presented for producing a transistor with an overlapping gate. The gate is placed on a substrate between two source/drain regions. The gate includes a polysilicon region on top of a dielectric region. Gate overlap regions are placed around the polysilicon region. The gate overlap regions extend out over the two source/drain regions. The gate overlap regions are formed of a metal-silicide layer, for example Titanium-silicide. A top portion of the metal-silicide layer is oxidized to form a silicon dioxide sealing layer on top of the metal-silicide layer. At the time of oxidation, the metal-silicide layer is also annealed to which further helps to improves the Titanium-silicide stoichiometry.

The two source/drain regions are formed using a first implant of atoms of a first conductivity type. After the gate overlap regions are formed, an additional implant of atoms of the first conductivity type may be performed in the two source/drain regions. For example, when the first conductivity type is n-type, the first implant of atoms may be an $n^-$ implant of Phosphores atoms, and the second implant of atoms may be an $n^+$ implant of Arsenic atoms. Alternately, when the first conductivity type is p-type, the first implant of atoms may be a $p^{31}$ implant of Boron atoms, and the second implant of atoms may be a $p^{30}$ implant of Boron atoms.

The present invention provides a method for construction of a GOLDD MOSFET which is fully compatible with current VLSI processes. The resultant structure has a low gate resistance. Further, the amount by which the gate overlaps the source/drain regions is controlled by varying the thickness of the metal-silicide layer and the silicon dioxide layer. Additionally, no etch back of the gate overlap region is required in the formation of the gate.

BRIEF DESCRIPTION OF THE DRAWINGS

FIG. 2 through FIG. 4 illustrate a method for producing a gate overlapped lightly doped drain MOSFET in accordance with the preferred embodiment of the present invention.

DESCRIPTION OF THE PRIOR ART

Figure 1:
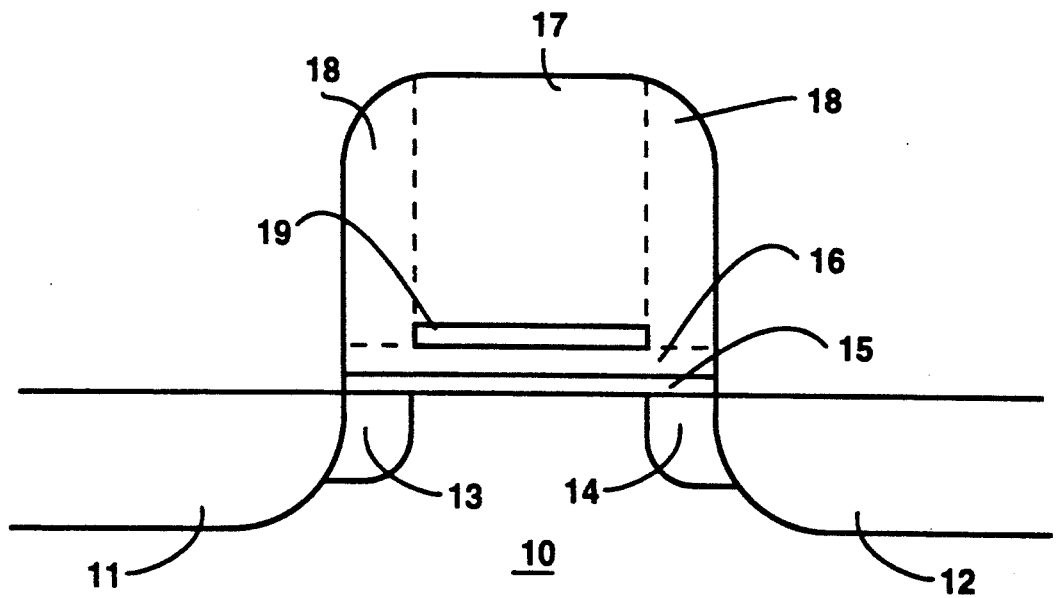
FIG. 1 illustrates a prior art process in which three polysilicon deposits are used to produce a gate overlapped lightly doped drain MOSFET.

FIG. 1 shows a structure resulting from a prior art TOPS process. Within a substrate 10 is implanted an $n^+$ region 11, an $n^+$ region 12, an $n^-$ region 13 and an $n^-$ region 14. A gate region is placed on top of an oxide layer 15. Oxide later 15 is on top of substrate 10. The gate region was constructed using a first polysilicon deposition to form a polysilicon region 16, a second polysilicon deposition to form a polysilicon region 17 and a third polysilicon deposition to form a polysilicon region 18. A thin oxide region 19 is buried within the gate region as shown.

The shown structure has improved performance and reliability over oxide spacer lightly doped drain devices (LDD). Further, devices using the above-described structure have shown a smaller sensitivity to $n^-$ dose variations. However, as discussed above, in the TOPS process, three deposits of polysilicon are use to form the gate region. The three polysilicon depositions makes the process impractical for use in manufacturing VLSI circuits.

DESCRIPTION OF THE PREFERRED EMBODIMENT

Figure 4:
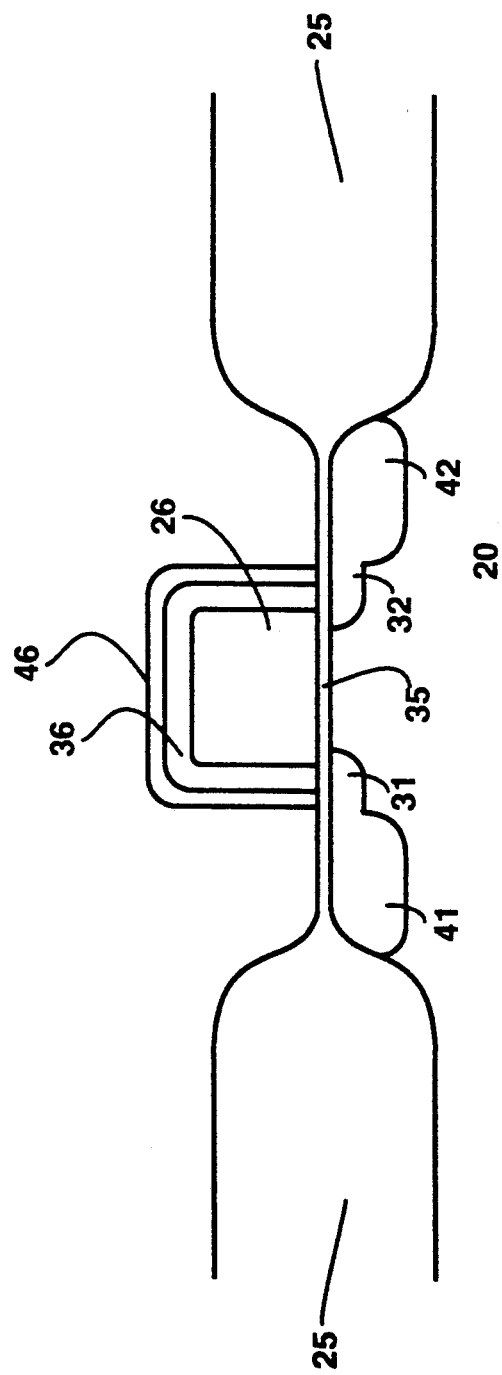

FIG. 2 through FIG. 4 illustrate a method for producing a gate overlapped lightly doped drain MOSFET in accordance with a preferred embodiment of the present invention.

The structure shown in FIG. 2 is formed in a well 20 of first conductivity type within a substrate. For example, the substrate may be of p-type material doped with $10^{15}$ atoms per cubic centimeter. Alternately, the substrate may be of n-type material. A typical depth of the substrate is 500 microns. Well 20 may be, for example, of p-type material doped with $10^{16}$ atoms per cubic centimeter. Alternately, well 20 may be of n-type material doped with $10^{16}$ atoms per cubic centimeter.

A local oxidation of silicon (LOCOS) process or other process is used to form an insulating layer 25 of, for example, field oxide on the substrate as shown. For example, in a LOCOS process, a layer of pad oxide is deposited. On top of the pad oxide, a layer of nitride is deposited. The nitride is patterned and etched. Field oxide is grown on the substrate at places where the nitride has been etched to expose the substrate. The nitride and pad oxide are then removed.

After insulating layer 25 is formed, a layer of gate oxide 35 is placed (i.e. grown or deposited) on exposed portions of the substrate. A first gate region 26 is formed on gate oxide layer 35 using a mask and etch process. Typically, first gate region 26 has a width 29 which is less than or equal to 0.8 microns. First gate region 26 may be made of polysilicon, for example, doped with n-type atoms at $10^{20}$ atoms per cubic centimeter. Gate region 26 may be formed, for example, by chemical vapor deposition (CVD) of a polysilicon layer. The polysilicon is doped using $POCl_3$. Alternately, an implant of Phosphor or Arsenic atoms may be used. Once deposited, the polysilicon layer is masked and etched to form first gate region 26.

On the sides of first gate region 26 are implanted a region 21 and a region 22 of second conductivity type. Region 21 and region 22 act as source/drain regions for a transistor. For example, region 21 and region 22 are $n^-$ regions doped with Phosphor at $10^{17}$ atoms per cubic centimeter. Region 21 and region 22 extend 0.15 micrometers below the surface of the substrate. Alternately, region 21 and region 22 may be $p^-$ regions. Region 21 is separated from region 22 by, for example, 0.8 microns or less. The resultant structure is shown in FIG. 2.

In order to produce the structure shown in FIG. 3, a metal layer is deposited over the top surface of the substrate. For example, the metal layer is Titanium (Ti) which is, for example, deposited by sputtering or chemical vapor deposition. The metal layer may consist of another metal such as, for example, Molybdenum (Mo), Chromium (Cr), Nickel (Ni), Platinum (Pt), Cobalt (Co), or Tantalum (Ta). The metal layer is, for example, 0.1 microns thick. After deposition of the metal layer, a rapid thermal anneal is used to form a metal-silicide region 36. When the metal layer is Titanium, metal-silicide region 36 is Titanium-silicide (TiSix). The rapid thermal anneal is done, for example, by heating the substrate to approximately 700 degrees Celsius for a period of approximately 15 seconds. Alternately, a furnace anneal may be used. Typically, the thickness of the Titanium-silicide will be 2.4 times the thickness of the originally deposited metal (Ti) layer. This ratio varies depending on the metal used to form the metal layer. The metal only reacts with the polysilicon region 26. The metal layer does not react where deposited over oxide. The unreacted metal is stripped off, for example using a mixture of $NH_4OH$, $H_2O_2$ and $H_2O$.

Region 36 of TiSix serves as a gate overlap region, which, with region 26, forms a gate which overlays the source/drain region of the transistor. For example, region 36 is 0.24 microns thick. Region 36 of TiSix is further annealed, for example at 900 degrees Celsius for 1 minute. This improves the stoichiometry of region 36 and causes it to become a stable $TiSi_2$. Region 36 is then oxidized to form a region 46 of $SiO_2$. Region 46 is, for example, 0.05 microns thick.

After region 36 is annealed and oxidized, a source/drain mask is used to perform a source/drain implant of a region 41 a region 42. For example, region 41 and region 42 are $n^+$ regions doped with Arsenic at a concentration of $10^{20}$ atoms per cubic centimeter. Region 41 and region 42 extend, for example, a depth of 0.25 microns below the surface of the substrate. Alternately, region 41 and region 42 may be $p^+$-regions doped with, for example, Boron. During the implant of region 41 and region 42, a portion 31 of region 21 and a portion 32 of region 22 are protected by region 46 and region 36 from the implant. Conventional methods may then be used to place an insulating layer over the surface of the substrate. For example, the insulating layer may be composed of a Boron Phosphor silicate glass (BPSG) layer on top of a TEOS layer. For example, the TEOS layer is 0.15 microns and the BPSG layer is 0.4 microns. The insulating layer is masked and etched. A metal layer is then deposited in contact with source/drain region 41 and source/drain region 42.

The present invention has several advantages over the prior art processes. For example, the present invention provides for a method which is simple, practical and fully compatible with current VLSI processes. The present invention utilizes self-aligned silicidation to produce a GOLDD structure which has a low gate resistance. Further, using the present invention, the amount by which the gate overlaps source/drain region 21 and source/drain region 22 can be controlled by varying the thickness of region 36 and region 46. Additionally, no etch back of region 36 and region 46 is required in the formation of the gate overlap region. Finally, the addition of region 46 allows for lowering the overlap Miller capacitance of the transistor.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for producing a transistor with an overlapping gate region, the method comprising the steps of:
    (a) forming on a substrate a polysilicon region on top of a dielectric region; the polysilicon region being used as part of a gate region;
    (b) performing a first implant of atoms of a first conductivity type into a first area and a second area of the substrate to form two source/drain regions;
    (c) depositing a metal layer covering the polysilicon region, the metal layer extending out over the two source/drain regions;
    (d) annealing the metal layer to form a metal-silicon layer;
    (e) oxidizing a top portion of the metal-silicide layer to form a silicon dioxide layer on top of the metal-silicide layer to that the metal-silicide layer and the silicon dioxide layer overlap the two source/drain regions; and
    (f) performing a second implant of atoms of the first conductivity type in portions of the two source/drain regions which are not protected by the metal-silicide layer and the silicon dioxide layer, wherein gate overlap in the transistor is controlled by varying thickness of the metal-silicide layer and thickness of the silicon dioxide layer.

2. A method as in claim 1 additionally comprising the step of:
    after step (d) and before step (e) annealing the metal-silicide layer.

3. A method as in claim 1 wherein the metal layer in step (c) comprises Titanium.

4. A method as in claim 1 wherein the first conductivity type is n-type, the first implant of atoms forms $n^-$ regions, and the second implant of atoms forms $n^+$ regions.

5. A method as in claim 1 wherein the first conductivity type is p-type, the first implant of atoms forms p⁻ regions, and the second implant of atoms forms p+ regions.

6. A method for producing a transistor with an overlapping gate region, the method comprising the steps of:
   (a) forming on a substrate a polysilicon region on top of a dielectric region; the polysilicon region being used as part of a gate region;
   (b) performing a first implant of atoms of a first conductivity type into a first area and a second area of the substrate to form two source/drain regions;
   (c) depositing a Titanium layer covering the polysilicon region, the Titanium layer extending out over the two source/drain regions; and
   (d) annealing the Titanium layer to form a metal-silicide layer;
   (e) oxidizing a top portion of the metal-silicide layer to form a silicon dioxide layer on top of the metal-silicide layer so that the metal-silicide layer and the silicon dioxide layer overlap the two source/drain regions; and
   (f) performing an implant of atoms of a first conductivity type in portion of the two source/drain regions which are not protected by the metal-silicide layer and the silicon dioxide layer, wherein gate overlap in the transistor is controlled by varying thickness of the metal-silicide layer and thickness of the silicon dioxide layer.

7. A method as in claim 6 additionally comprising the step of:
   after step (d) and before step (e), annealing the metal-silicide layer.

8. A method as in claim 6 wherein the first conductivity type is n-type the first implant of atoms forms n⁻ regions, and the second implant of atoms forms n+ regions.

9. A method as in claim 6 wherein the first conductivity type is p-type, the first implant of atoms forms p⁻ regions, and the second implant of atoms forms p+ regions.

* * * * *